（12）United States Patent
Beasom

(10) Patent No.: US 6,979,624 B2
(45) Date of Patent: Dec. 27, 2005

(54) REDUCED MASK COUNT BURIED LAYER PROCESS

(75) Inventor: James D. Beasom, Melbourne Village, FL (US)

(73) Assignee: Intersil Americas Inc., Milipitas, CA (US)

( * ) Notice: Subject to any disclaimer, the term of this patent is extended or adjusted under 35 U.S.C. 154(b) by 13 days.

(21) Appl. No.: 10/685,972

(22) Filed: Oct. 15, 2003

(65) Prior Publication Data

US 2004/0171229 A1      Sep. 2, 2004

Related U.S. Application Data

(62) Division of application No. 10/082,852, filed on Feb. 25, 2002, now abandoned.

(51) Int. Cl.$^7$ .................. H01L 21/265; H01L 21/4125
(52) U.S. Cl. ........................ 438/309; 438/526
(58) Field of Search ................ 438/149–378, 438/510–532

(56) References Cited

U.S. PATENT DOCUMENTS

| | | | |
|---|---|---|---|
| 4,875,086 A | 10/1989 | Malhi et al. | |
| 4,897,698 A | 1/1990 | Zorinsky et al. | |
| 5,126,278 A * | 6/1992 | Kodaira | 438/350 |
| 5,256,582 A | 10/1993 | Mosher et al. | |
| 5,516,709 A * | 5/1996 | Yamazaki | 438/309 |
| 5,581,103 A * | 12/1996 | Mizukami | 257/355 |
| 5,633,180 A | 5/1997 | Bajor | |
| 5,637,516 A | 6/1997 | Muller | |
| 5,643,820 A * | 7/1997 | Williams et al. | 438/394 |
| 5,652,153 A | 7/1997 | Beasom | |
| 5,814,538 A | 9/1998 | Kim et al. | |
| 5,880,014 A * | 3/1999 | Park et al. | 438/527 |
| 5,892,264 A | 4/1999 | Davis et al. | |
| 5,897,362 A | 4/1999 | Wallace | |
| 6,146,956 A | 11/2000 | Pinto et al. | |
| 6,225,181 B1 | 5/2001 | Gregory | |
| 6,258,641 B1 | 7/2001 | Wong et al. | |
| 6,432,791 B1 * | 8/2002 | Hutter et al. | 438/381 |
| 6,525,376 B1 * | 2/2003 | Harada et al. | 257/343 |
| 6,624,497 B2 * | 9/2003 | Beasom | 257/511 |
| 6,831,346 B1 * | 12/2004 | Li et al. | 257/499 |
| 6,838,328 B1 * | 1/2005 | Burr | 438/199 |
| 6,897,103 B2 * | 5/2005 | Beasom | 438/214 |
| 2001/0031525 A1 * | 10/2001 | Violette et al. | 438/203 |
| 2002/0020858 A1 * | 2/2002 | Doyle | 257/204 |
| 2002/0053685 A1 * | 5/2002 | Pendharker et al. | 257/204 |

OTHER PUBLICATIONS

Sze, S.M. "Semiconductor Devices, Physics and Technology" John Wiley & Sons, p. 384.

Rupit Patel, et al., A 30V Complementary Bipoar Technology on SOI for High Speed Precision Analog Circuits, 1997 IEEE BCTM, pp. 48-50.

MC Wilson, et al., Process HJ: A 30 GHz NPN and 20 GHz PNP Complementary Bipolar Process for High Linearity RF Circuits, 1998 IEEE BCTM, pp. 164-167.

* cited by examiner

*Primary Examiner*—Savitri Mulpuri
(74) *Attorney, Agent, or Firm*—Barnes & Thornburg LLP

(57) ABSTRACT

An N type buried layer is formed, in one embodiment, by a non selective implant on the surface of a wafer and later diffusion. Subsequently, the wafer is masked and a selective P type buried layer is formed by implant and diffusion. The coefficient of diffusion of the P type buried layer dopant is greater than the N type buried layer dopant so that connections can be made to the P type buried layer by P wells which have a lower dopant concentration than the N buried layer.

31 Claims, 13 Drawing Sheets

REDUCED MASK COUNT BURIED LAYER PROCESS

CROSS-REFERENCE TO RELATED APPLICATIONS

This application is a division of application Ser. No. 10/082,852, filed Feb. 25, 2002 now abandoned.

Related to a corresponding application entitled A Semiconductor Device Manufacturing with a Reduced Mask Count Buried Layer.

BACKGROUND OF THE INVENTION

1. Field of the Invention

This invention relates to semiconductor devices and its manufacturing method, and, more specifically, to the formation of buried layers in such devices.

2. Description of Related Art

It is well known in semiconductor processing that the minimization of the number of masking operations in fabricating a semiconductor device is a constant goal. Thus processes which can eliminate a masking operation are highly desirable in the semiconductor processing art.

Fabrication of complementary vertical bipolar devices for analog signal processing on a single integrated circuit with N type and P type buried layers are known in the art. For example, Rupit Patel et al, "a 30V Complementary Bipolar Technology on SOI for High Speed Precision Analog Circuits," IEEE BCTM, pp. 48–50, 1997, and M. C. Wilson et al, "Process HJ: A 30 GHz NPN and 20 GHz PNP Complementary Bipolar Process for High Linearity RF Circuits," IEEE BCTM, pp. 164–167, 1998, describe examples of these types of circuits. In both publications the circuits taught use both N type and P type buried layers which are formed using separate mask and implant steps to form each buried layer. This requires two masks and two implants to form the two buried layers.

BRIEF SUMMARY OF THE INVENTION

It is therefore an object of this invention to provide a semiconductor processing method which provides a non selective N buried layer without requiring a masking operation, together with a selective P type buried layer which is formed using a mask. It is also an object of this invention to provide a semiconductor device with a non selective N type buried layer and a selective P type buried layer.

According to the invention, there is provided a semiconductor process wherein a non selective N type buried layer and a selective P type buried layer are formed on a semiconductor device, the dopant used as the N type buried layer dopant having a lower diffusion coefficient than the dopant used as the P type buried layer dopant.

According to the invention, there is further provided a semiconductor device having a non selective N type buried layer and a selective P type buried layer formed on a semiconductor device, the N type majority dopant present in the N type buried layer dopant having a lower diffusion coefficient than the P type majority dopant present in the P type buried layer dopant.

BRIEF DESCRIPTION OF THE DRAWINGS

The aforementioned and other features, characteristics, advantages, and the invention in general will be better understood from the following more detailed description taken in conjunction with the accompanying drawings, in which.

Figure 1A:
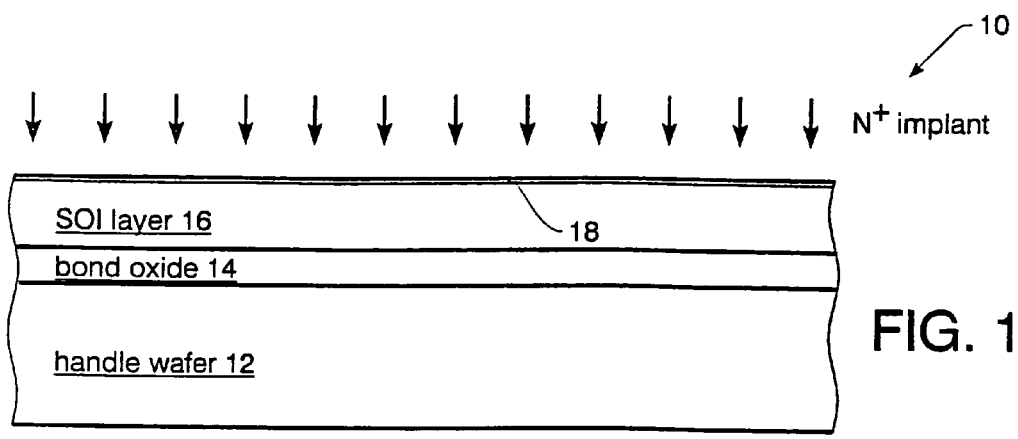
FIGS. 1a–1f are diagrammatical fragmentary cross sections of a portion of a structure used in the fabrication of an integrated circuit which depict a dual N+ and P+ buried layer structure with a non selective N+ buried layer utilizing both vertical and lateral dielectric insulation.

It will be appreciated that for purposes of clarity and where deemed appropriate, reference numerals have been repeated in the figures to indicate corresponding features, and that the various elements in the drawings have not necessarily been drawn to scale in order to better show the features of the invention.

DETAILED DESCRIPTION OF THE INVENTION

Turning now to the drawings, all of which are diagrammatical fragmentary cross sections of a portion of a structure used in the fabrication of an integrated circuit, FIGS. 1a–1f depict a dual N+ and P+ buried layer structure with a non selective N+ buried layer utilizing both vertical and lateral dielectric insulation.

As used herein the term "buried layer" refers to a conductive region in a silicon wafer as that term is known in the art for a completed device, and also, during processing of the device, to certain regions which may be located on the surface and elsewhere in a wafer which will become buried layers in a completed device.

FIG. 1a depicts a portion 10 having a silicon carrier or handle wafer 12, an insulator in the form of a bond oxide 14, an silicon-over-insulator (SOI) layer 16 and a surface layer 18 of N type dopants implanted on the entire top surface of the SOI layer 16 as depicted by the arrows at the top of FIG. 1a. The N type dopant implanted in the surface layer 18 is preferably, but not necessarily, arsenic (As) or antimony (Sb), and, in one preferred embodiment, Sb is implanted at an integrated dose of $3.75 \times 10^{14}$ atoms/cm$^2$.

Figure 1B:
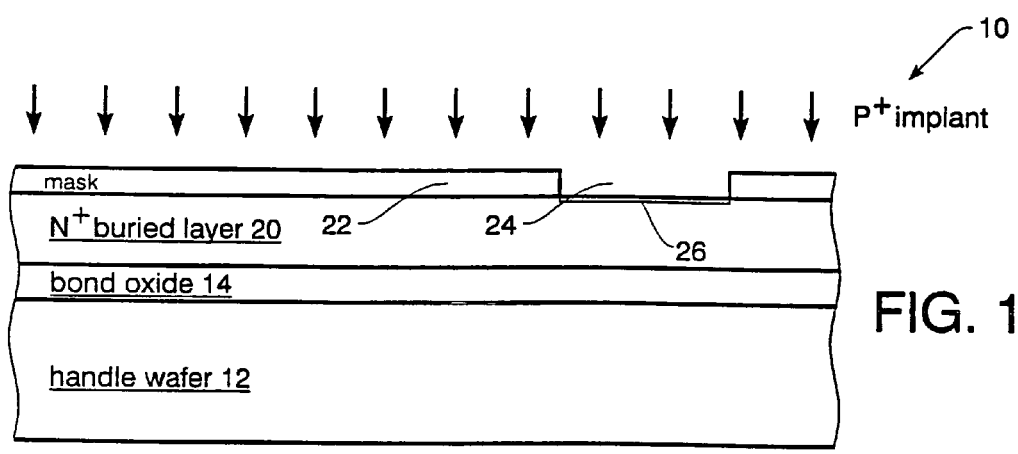

FIG. 1b is FIG. 1a after several process steps including a diffusion operation which causes the N type dopant in the surface layer 18 to diffuse completely into the SOI layer 16 to form an N+ buried layer 20. One example of an N+ buried layer formed in this manner is 2.5 microns thick containing Sb at a concentration of $1.5 \times 10^{18}$ atoms/cm$^3$, producing a 0.02 Ωcm layer.

There are alternative methods of controlling the doping level in the N+ buried layer 20. A first alternative is to form the non selective N+ SOI layer 16 directly by epitaxial growth without an N+ implant. In a second alternative, which is one preferred embodiment as depicted in FIG. 1a, the SOI layer 16 is initially lightly doped and a non selective N+ implant is then made into its surface. This method provides more precise control of the dose and location of the N+ dopant. It also allows use of commercially available bonded wafers as starting material. A third alternative is described below with reference to FIGS. 3a–3d. The common feature of these three versions is that the N+ buried layer is non selective across the entire wafer and is formed without a masking step.

Also shown in FIG. 1b is a mask 22 having an opening 24 through which P type dopants are implanted, as indicated by the arrows at the top of FIG. 1b, to form a surface layer 26 of P type dopants in opening 24. In one preferred embodiment boron is implanted at a dose level of $1.5 \times 10^{15}$ atoms/cm$^2$ to form the surface layer 26.

Figure 1C:
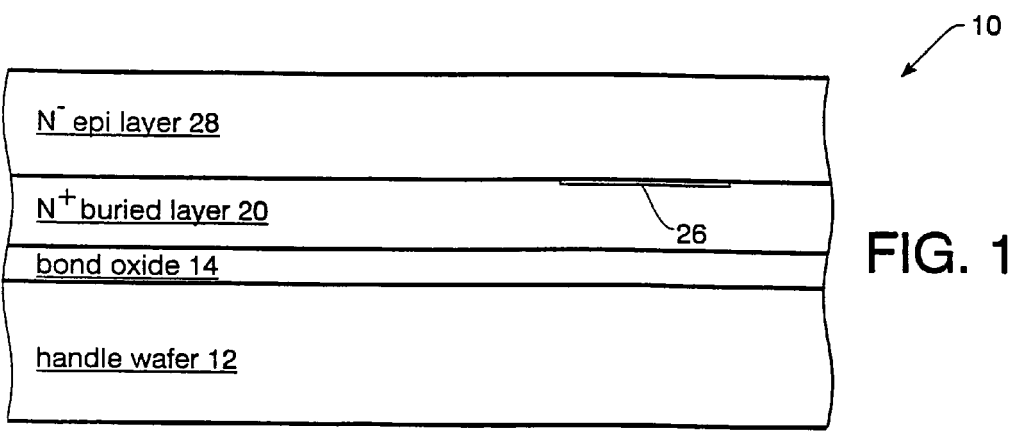

In FIG. 1c mask 22 has been removed, and an N– epitaxial (epi) layer 28 has been grown onto the N+ buried layer 20. In one preferred the embodiment N– epi layer 28 is grown to a thickness needed to support the desired breakdown voltage of the final integrated circuit transistor, for example 5 to 10 microns for a 30 volt device.

Figure 1D:
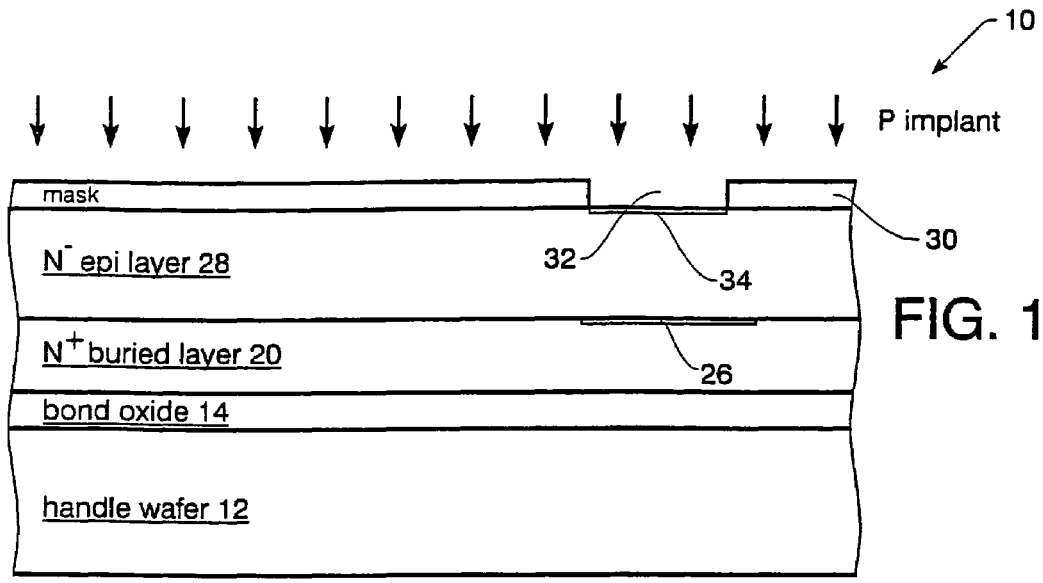

FIG. 1d depicts a further processed portion 10. After a mask 30 with an opening 32 has been applied to the N– epi layer 28, P type dopants are implanted, as indicated by the arrows at the top of FIG. 1d, to form a surface layer 34 of P type dopants in the opening 32.

Figure 1E:
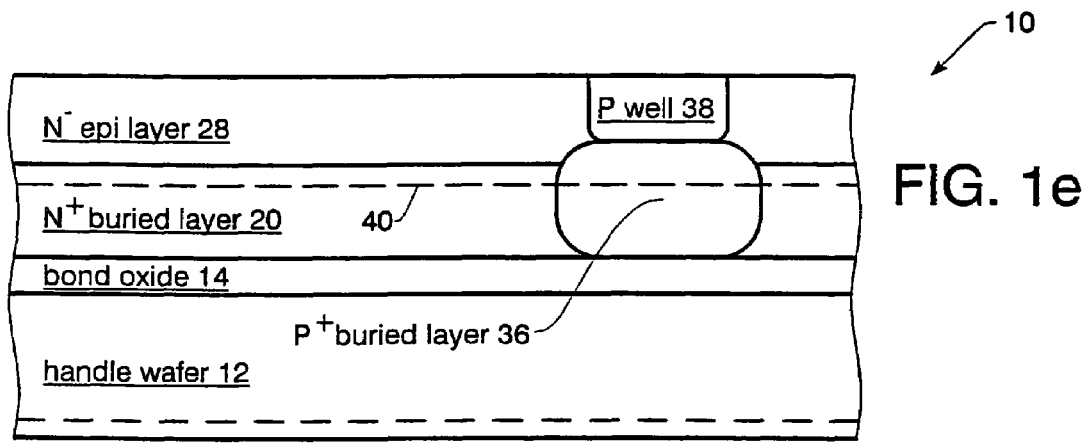

FIG. 1e depicts the portion 10 after the mask 30 has been removed and a diffusion process performed which enlarges the N+ buried layer 20, forms a P+ buried layer 36 from the P type surface layer 26 and forms a P well 38 from the P type surface layer 34. The dashed line 40 indicates the original boundary between the N– epi layer 28 and the N+ buried layer 20. The dopant in the P+ buried layer 36 will over compensate the dopant in the N+ buried layer 20 in the region below the surface layer 26 of FIG. 1b leaving net P type down to the bond oxide 14.

Advantageously the dopant in P+ buried layer 36 is selected to have a higher diffusion coefficient than the N+ dopant in the N+ buried layer 20 so that the P+ buried layer 36 will out diffuse further into the overlaying N – epi layer 28 to connect with the P well 38 to form a P type buried layer at the bottom of the P well 38. If the dopant forming the N+ buried layer 20 had a higher diffusion coefficient than the dopant forming the P+ buried layer 36, the N+ buried layer 20 would extend above the P+ buried layer 36, and the P well 38 would have to have a high enough dose concentration to over compensate the N+ buried layer 20 in order to make a connection with the P+ buried layer 36. If the P well 38 is the collector of a PNP transistor used, for example, for analog signal processing, then the N+ buried layer 20 would not be over compensated since the dopant concentration in the collector of such a transistor is several orders of magnitude less than the heavy doping generally used to form an N+ buried layer. While there are relatively slow and fast diffusing N type dopants, there is no slow diffusing P type dopant presently being used in silicon semiconductor manufacturing. Thus, with the dopants commonly used in semiconductor manufacturing, a non selective P+ buried layer cannot practically be used with a selective N+ buried layer in silicon.

Figure 1F:
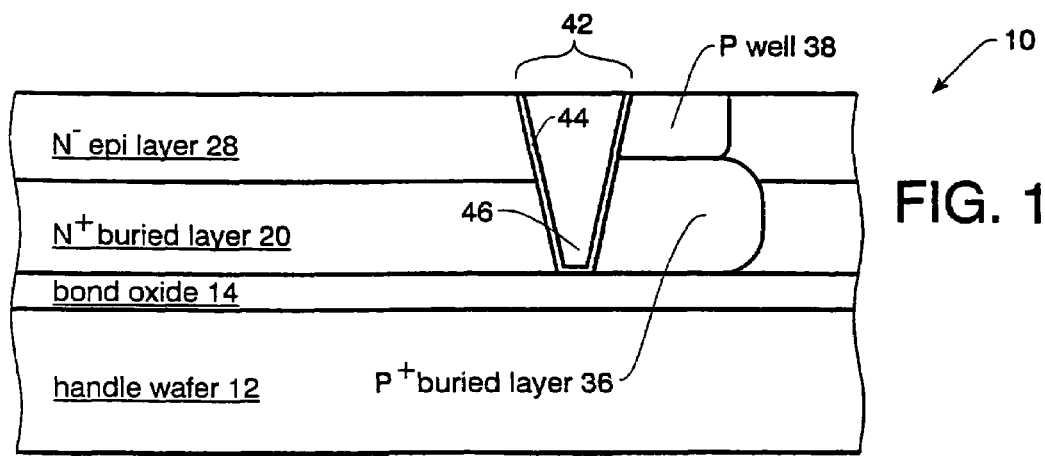

FIG. 1f depicts the structure of FIG. 1d with the addition of a lateral isolation trench 42 thereby providing lateral as well as vertical dielectric isolation. The lateral isolation trench 42 may alternatively be formed before the process steps indicated in FIG. 1d.

In FIG. 1f the lateral isolation trench 42 is advantageously located contiguous to the P well 38 and the P+ buried layer 36 thus avoiding an isolated N+ buried layer region between the lateral isolation trench 42 and the P+ buried layer 36 which would result if the lateral isolation trench 42 were spaced apart from the P well 38 and the P+ buried layer 36.

As shown in FIGS. 1a–1f dual P+ and N+ buried layers (P+ buried layer 36 and N+ buried layer 20, respectively) have been formed wherein the N+ buried layer is non selective, formed across the wafer without requiring a mask for the buried layer. In one preferred embodiment both buried layers have a sheet resistance of about 100 Ω per square.

As described above and shown in FIGS. 1a–1f, the P+ buried layer 36 is formed by an initial implant of P type dopants into a surface layer 26 but not diffused until after the N– epi layer 28 is grown and the P well 38 is formed by an initial implant of P type dopants into a surface layer 34. In an alternative process the P+ buried layer 36 is diffused down into the N– SOI layer 16 after being implanted but before the N– epi layer 28 is grown. In either case the total Dt (diffusion coefficient multiplied by diffusion time) experienced by the P+0 region 26 is $1.9 \times 10^{-8}$ cm$^2$ in one preferred embodiment, most of it to also down diffuse P well 36 in the case of this alternative process. Designs for other applications may require quite different Dt's as is well known in the art.

Figure 2:
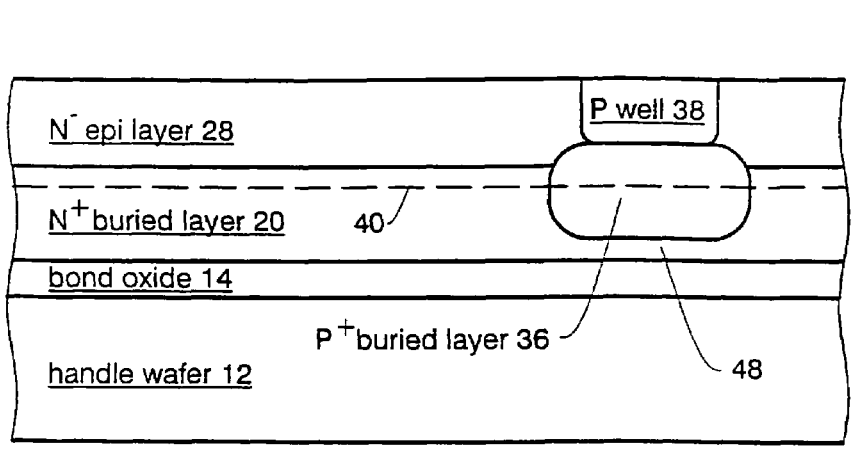
FIG. 2 is a alternate embodiment of FIG. 1e.

FIG. 2 depicts another alternative embodiment of the structure of FIG. 1e wherein the depth of P+ buried layer 36 does not reach all the way to the bond oxide 14. When a high enough implant dose of P type is used, the P+ buried layer 36 will diffuse down to the bond oxide layer 14 as shown in FIG. 1e, and over compensate the entire thickness of the N+ buried layer 20 leaving a net P type region everywhere in the regions implanted. However, if a lower P+ implant dose is used, a vestigial floating N+ region 48 will be left adjacent to bond oxide 14 under the P+ buried layer 36 as shown in FIG. 2. This is acceptable in cases where no connection is made to the N+ buried layer 20 and the P+ buried layer 36 is connected to the P well 38 as desired. Residual N+ region 48 may also occur with a thicker SOI layer 16, a greater N+ buried layer doping or thickness, or a smaller Dt applied to the P+ buried layer, or combinations of these factors.

FIGS. 3a–3d depict an alternate method of forming the N+ buried layer 20 of FIG. 1b.

Figure 3A:
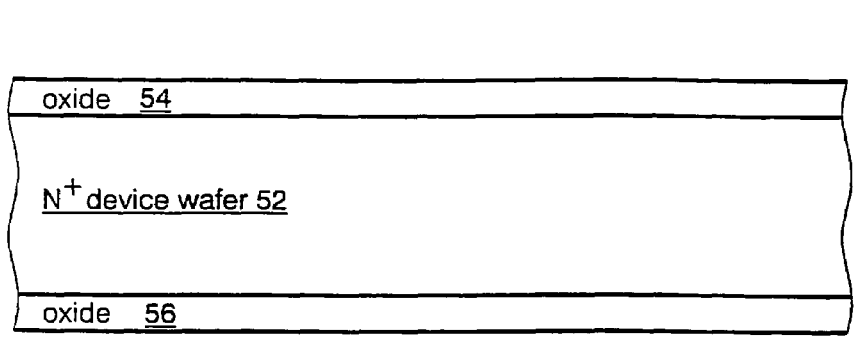
FIGS. 3a–3d illustrate an alternate process of forming the N+ buried layer of FIG. 1b.

FIG. 3a depicts a portion 50 having an N+ device wafer 52 with a top oxide layer 54 and a bottom oxide layer 56. The top oxide layer 54 and bottom oxide layer 56 may be formed by oxidizing the N+ device wafer 52. In one preferred embodiment the N+ device wafer 52 is doped with a relatively slow diffusion coefficient dopant such as As or Sb. The doping level is selected at the level desired for the buried layer in the design, such as $1.5 \times 10^{18}$ atoms/cm$^3$ as described above with respect to FIG. 1a.

Figure 3B:
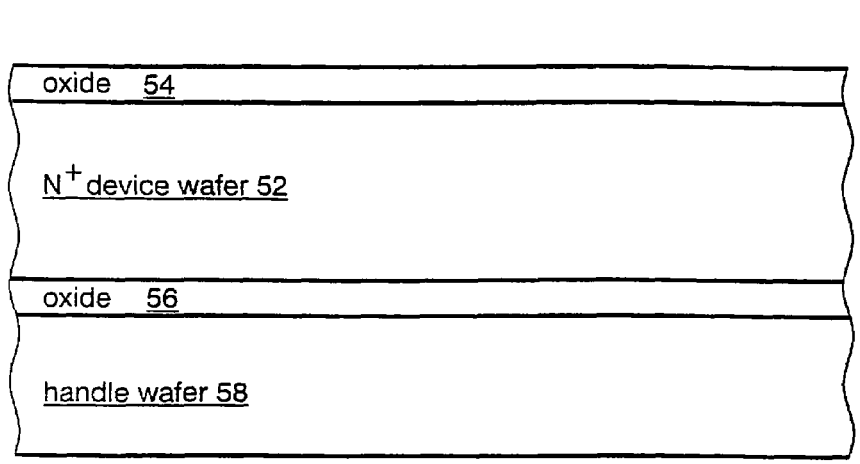

FIG. 3b is FIG. 3a with a handle wafer 58 bonded to the bottom oxide 56.

Figure 3C:
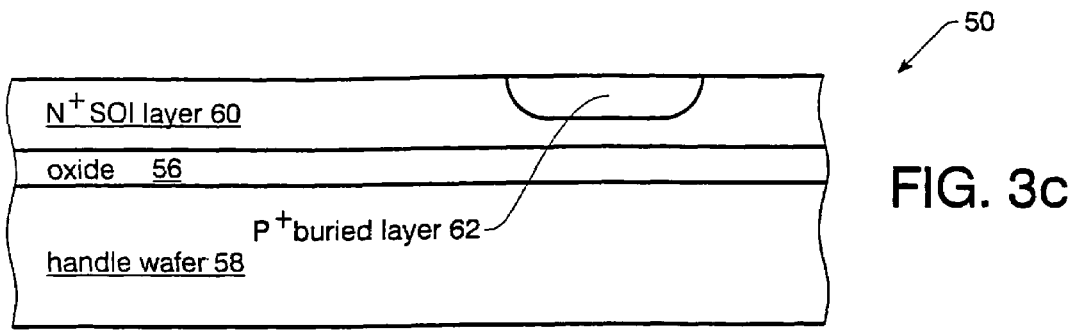

FIG. 3c is FIG. 3b with the top oxide 54 and the top portion of the N+ device wafer 52 removed to provide an N+ SOI layer 60 which is also an N+ buried layer. Also, a P+ buried layer 62 has been formed in the top of the N+ SOI layer 60. The P+ buried layer 62 is formed by masking, implantation and diffusion in the manner described above with respect to FIGS. 1b and 1e.

Figure 3D:
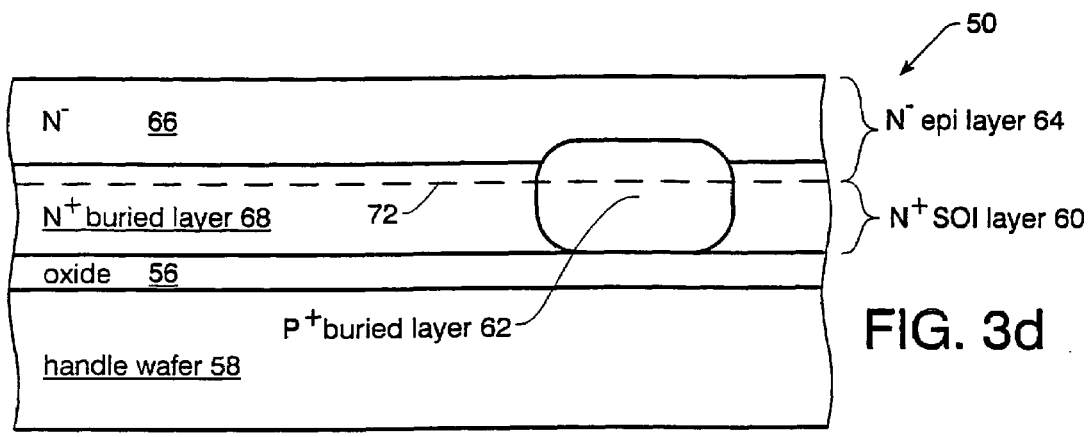

FIG. 3d is FIG. 3c after the growth of an epi layer 64. The N+ SOI layer 60 up diffuses into the epi layer 64 and the resulting structure has an N– layer 66 on top of an N+ buried layer 68. The P+ buried layer 62 also up diffuses into the epi layer 64. The dotted line 72 indicates the top of the N+ SOI layer 60 and the bottom of the epi layer 64. The P well 38 shown in FIG. 1e can then be formed using masking, implantation and diffusion as described above.

This method of FIGS. 3a–3d eliminates the N+ implant step and the following diffusion described above with respect to FIGS. 1a and 1b.

FIGS. 4a–4i depict a dual N+ and P+ buried layer structure with a non selective N+ buried layer utilizing vertical junction isolation and lateral dielectric isolation.

Figure 4A:
FIGS. 4a–4k are diagrammatical fragmentary cross sections of a portion of a structure used in the fabrication of an integrated circuit which depict a dual N+ and P+ buried layer structure with a non selective N+ buried layer utilizing vertical junction insulation and lateral dielectric insulation.

FIG. 4a depicts a portion 80 having a P– substrate 82 containing an N– isolation region 84. The N-isolation region 84 provides a conventional junction isolation and can be doped using, for example, phosphorus.

Figure 4B:
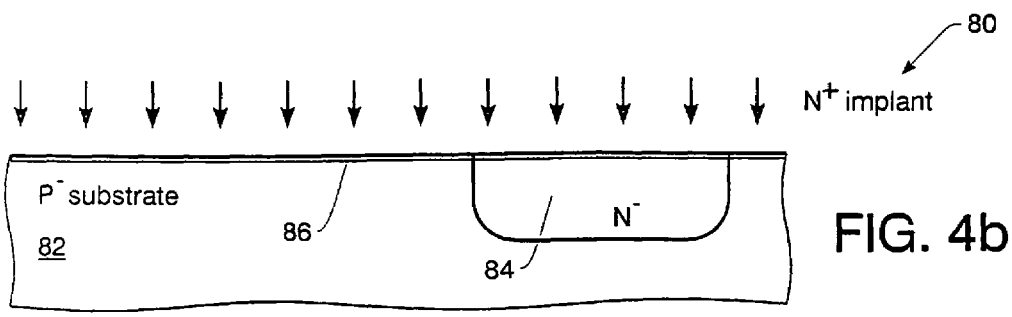

FIG. 4b is FIG. 4a after a further processing of portion 80 in which an N+ surface layer 86 has been non selectively implanted, as depicted by the arrows at the top of FIG. 4b. The N+ surface layer 86 is implanted using, for example, a slow diffusing dopant by any conventional method such as implant of arsenic.

Figure 4C:
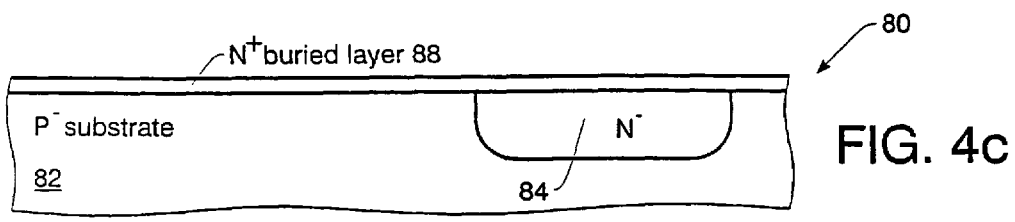

FIG. 4c is FIG. 4b after a diffusion process which produces an N+ buried layer 88 produced by the diffusion of the surface layer 86. In one preferred embodiment the majority N type dopant in the N+ buried layer 88 is arsenic since it has a lower diffusion coefficient than phosphorus which is used to form the N– isolation region 84.

Figure 4D:
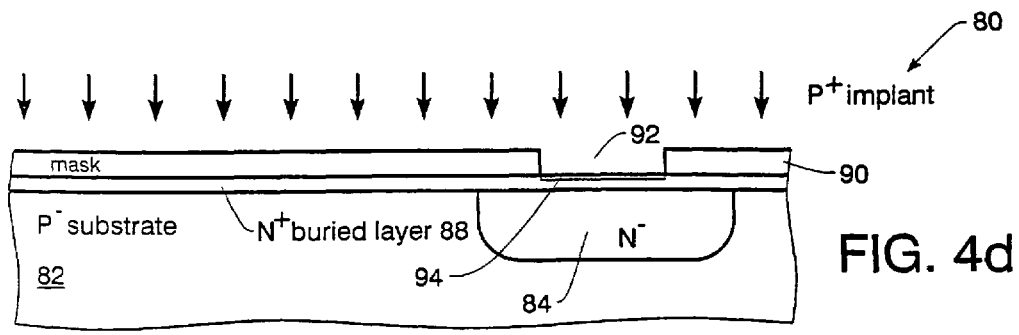

FIG. 4d depicts a further processing of portion 80 utilizing a mask 90 having an opening 92 through which P type dopants are implanted, as indicated by the arrows at the top of FIG. 4d, to form a surface layer 94 of P type dopants in the opening 92. In one preferred embodiment boron, which has a higher diffusion coefficient than arsenic used in the implantation of FIG. 4b, is selected for this P type implant.

Figure 4E:
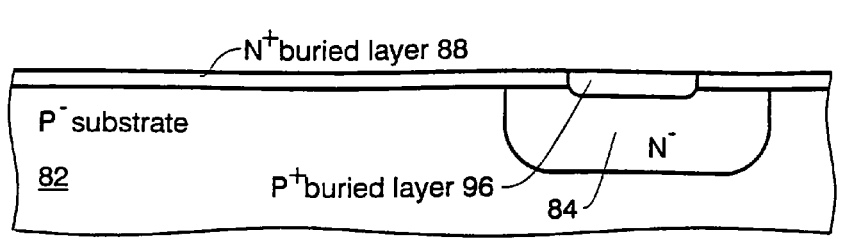

In FIG. 4e a P+ buried layer 96, produced by the diffusion of the surface layer 94, has been formed within the N+ buried layer 88 and the N– isolation region 84.

Figure 4F:
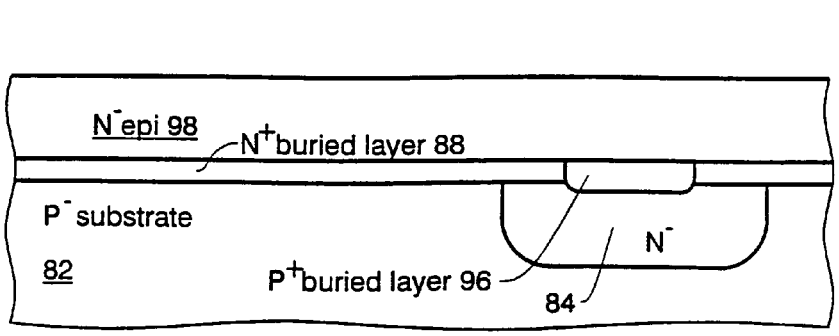

In FIG. 4f an N– epi layer 98 has been grown on top of the structure of FIG. 4e.

Figure 4G:
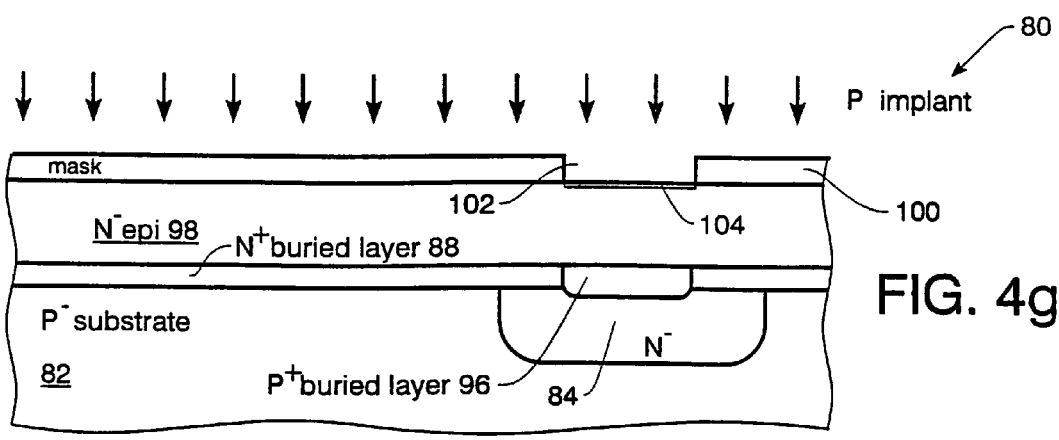

FIG. 4g depicts a further step in the processing in which a mask 100 is applied to the surface of the wafer with an openings 102 through which a surface layer 104 is formed by P type implantation as indicated by the arrows at the top of FIG. 4g. Again, in one preferred embodiment, boron is the dopant used to form the surface layer 104.

Figure 4H:
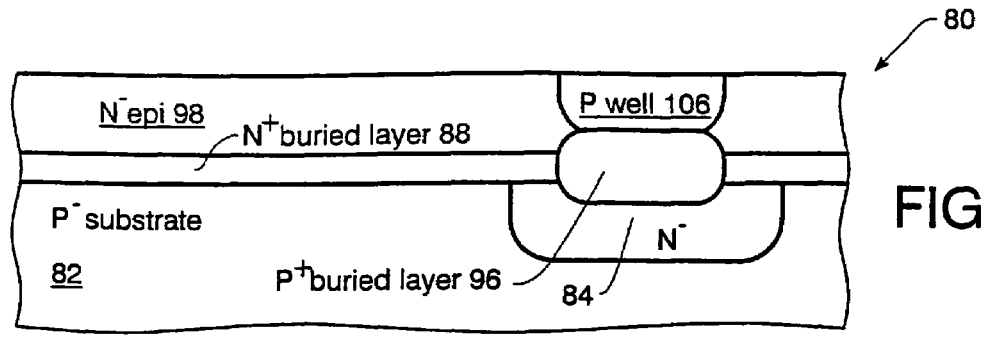

FIG. 4h depicts the structure of FIG. 4g after the mask 100 has been removed and another diffusion operation performed. As shown in FIG. 4h the diffusion of the surface layer 104 produces a P well 106 which has diffused down to intersect the up diffused P+ buried layer 96. The P well 106 can form the collector of a PNP transistor (not shown in the drawings).

As shown in FIG. 4h the P+ buried layer 96 up diffuses further than the N+ buried layer 88 because it is made with a dopant that has a higher diffusion coefficient than the dopant used to form the N+ buried layer 88 and has been subjected to a sufficiently large Dt. The P+ buried layer 96 implant dose may be chosen high enough that it over compensates the N+ buried layer 88 throughout its entire thickness. An alternative structure, similar to that described above with respect to FIG. 2, may arise in which a region of net N, corresponding to region 48 of FIG. 2, connected at its ends to the N– isolation region is left in the middle of the P+ buried layer. This alternative structure results from alternative processing as described above with reference to FIG. 2.

Figure 4I:
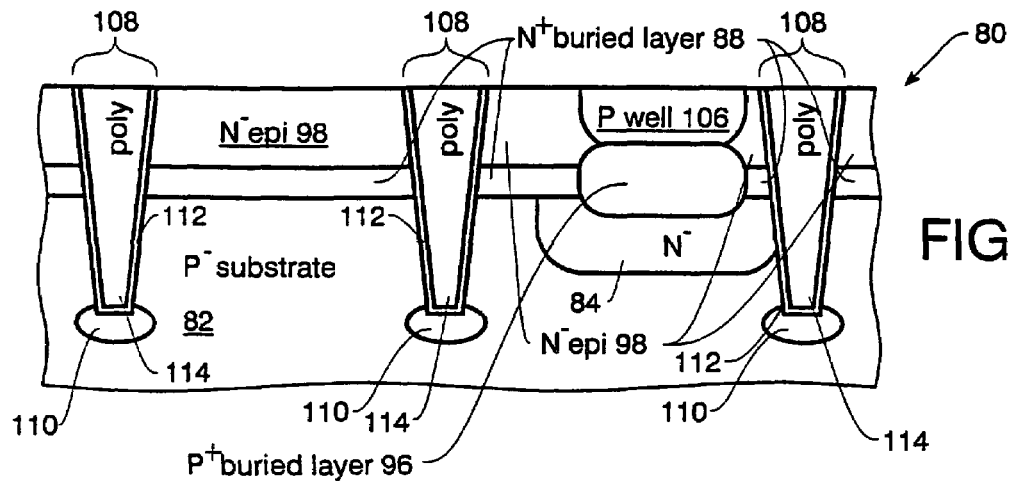

In FIG. 4i three lateral isolation trenches 108 have been etched from the surface of portion 80 down into the P– substrate 82 below the depth of the N– isolation region 84. Channel stop implants 110 were made into the bottoms of the lateral isolation trenches 108, and isolation dielectric layers 112 were formed on the sides of the lateral isolation trenches 108 which were then filled with polysilicon 114. These isolation trenches can also be formed before the process indicated in FIG. 4g.

Figure 4J:
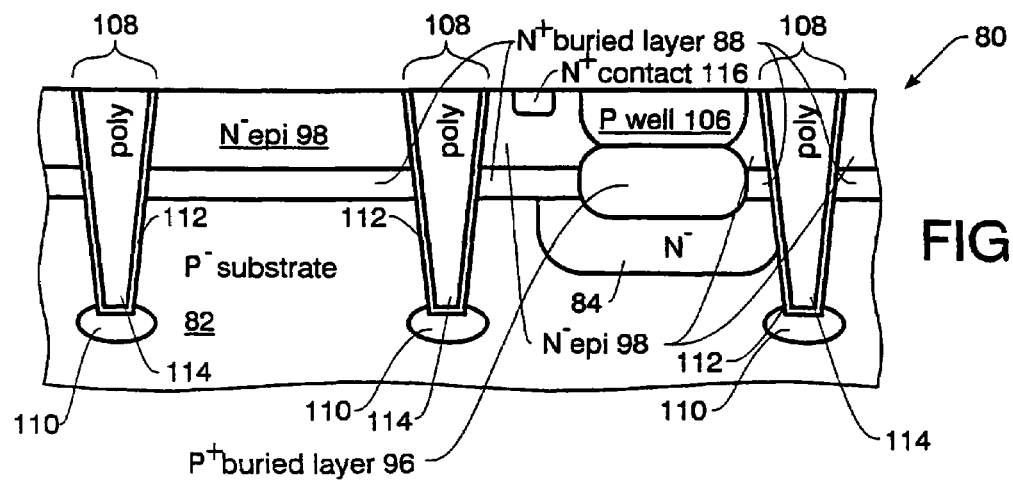

In FIG. 4j an N+ contact 116 to the N– epi layer 98 and near the P well 106 has been formed in the surface to provide an ohmic contact to the N– epi layer 98. The N+ contact 116 is typically formed by a step used to form some other device region such as emitter and collector contacts for NPN devices. The N+ contact 116 connects to the N– isolation region 84 through the continuous path of N type material comprising the N-epi layer 98 and the N+ buried layer 88 to provide an ohmic connection between a surface conductor (not shown) contacting the N+ buried layer 88 and the N-isolation region 84. The surface conductor might, for example, connect the N+ contact 116 to the P well 106 that might be the collector of a PNP transistor. The N+ contact 116 can also be used, if desired, in a fully dielectrically isolated structure such as shown in FIG. 1f.

FIG. 4j, in contrast to FIG. 1f, depicts the lateral isolation trenches 108 on either side of the P well 106 as spaced apart from the P well 106 and the P+ buried layer 96. At least one of these isolation trenches 108 must be spaced apart to allow room for an N+ contact to provide an N type electrical path to the N– isolation layer 84. Since the N– isolation layer 84 meets the N+ buried layer 88 on both sides of the P+ buried layer 96 thereby forming an electrical connection to the two N+ buried layer regions, both of the lateral isolation trenches 108 may be spaced apart from the P well 106 and the P+ buried layer 96.

Figure 4K:
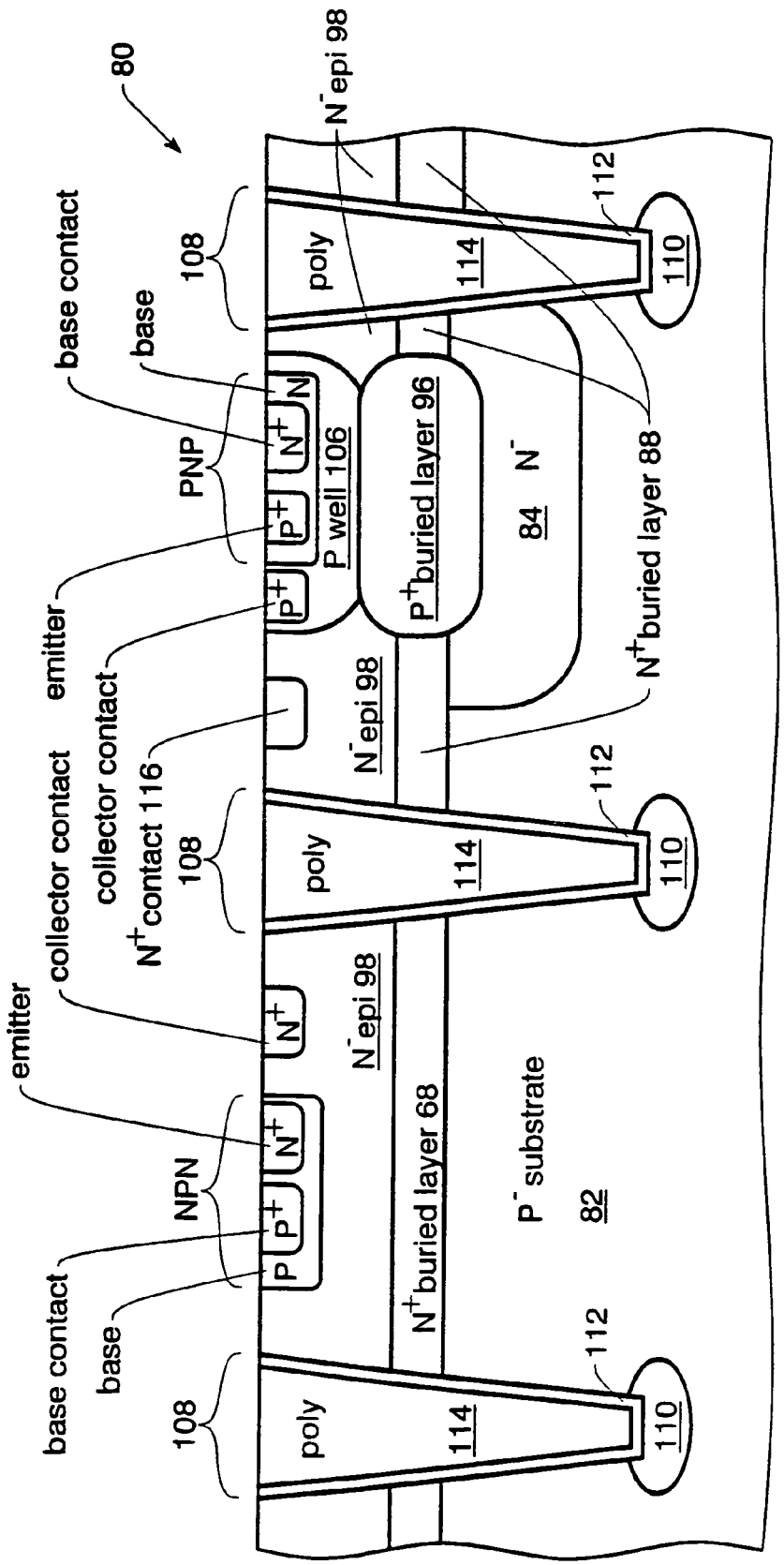

FIG. 4k is FIG. 4j with the addition of an NPN transistor and a PNP transistor including the respective collector contacts, bases and base contacts, and emitters.

As shown in FIGS. 4a–4k dual P+ and N+ buried layers (P+ buried layer 96 and N+ buried layer 88, respectively) have been formed wherein the N+ buried layer is non selective, formed across the wafer without requiring a mask for the buried layer.

FIGS. 5a–5g, 6a–6e and 7a–7c depict a dual N and P buried layer structure with a non selective N buried layer in which the buried layers are formed in a surface of the device wafer that becomes the bottom of the final device island. More particularly, FIGS. 5a–5g and 6a–6e depict a bonded wafer structure, and FIGS. 7a–7c depict a single poly dielectric isolation structure.

Figure 5A:
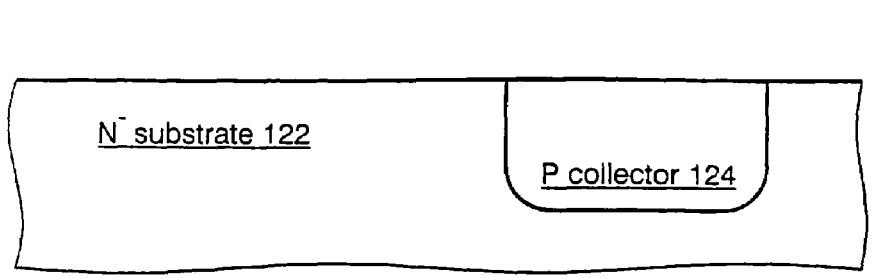
FIGS. 5a–5g are diagrammatical fragmentary cross sections of a portion of a structure used in the fabrication of an integrated circuit which depict a dual N+ and P+ buried layer bonded wafer structure with a non selective N+ buried layer in which the buried layers are formed in a surface of the device wafer that become the bottoms of the final device islands.

FIG. 5a depicts a portion 120 having an N– substrate 122 containing a P collector 124. The structure of FIG. 5a may be formed by, for example, starting with an N-wafer and then implanting and diffusing boron to form the back diffused P collector 124.

Figure 5B:
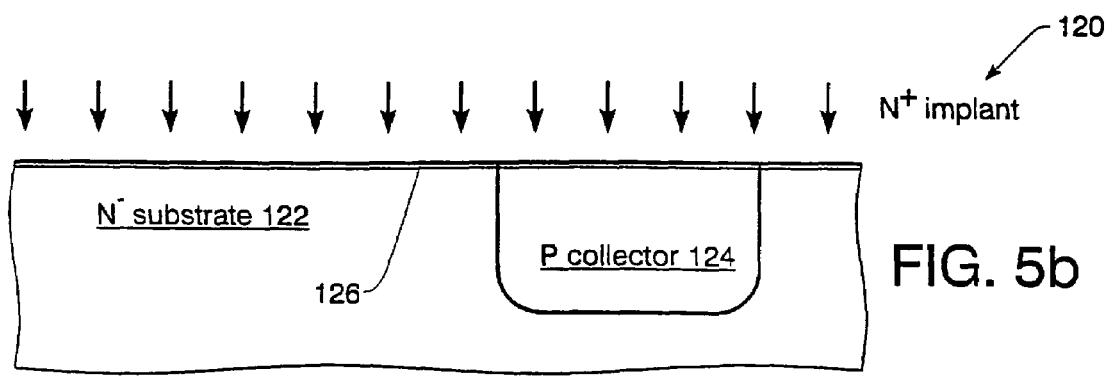

FIG. 5b depicts a further processing of portion 120 of FIG. 5a in which an N+ surface layer 126 has been non selectively implanted, as depicted by the arrows at the top of FIG. 5b. The N+ surface layer 126 is implanted using, for example, a slow diffusing dopant by any conventional method such as implant of arsenic. The N+ layer 106 can alternatively be formed by epitaxial deposition on the surface of the substrate 122 after deposition of the P collector 124.

Figure 5C:
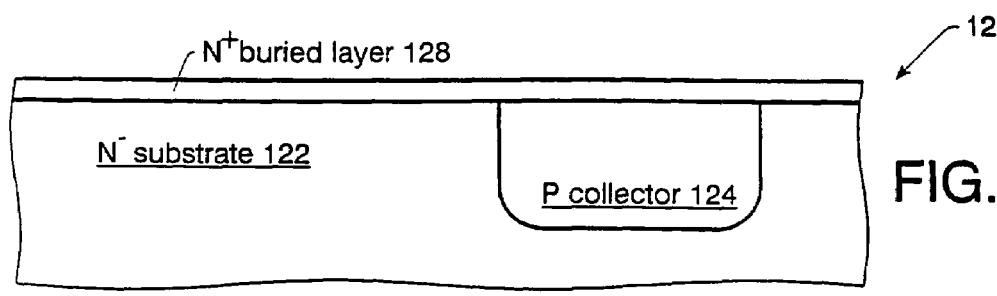

FIG. 5c is FIG. 5b after a diffusion process producing an N+ buried layer 128 by the diffusion of the surface layer 126.

Figure 5D:
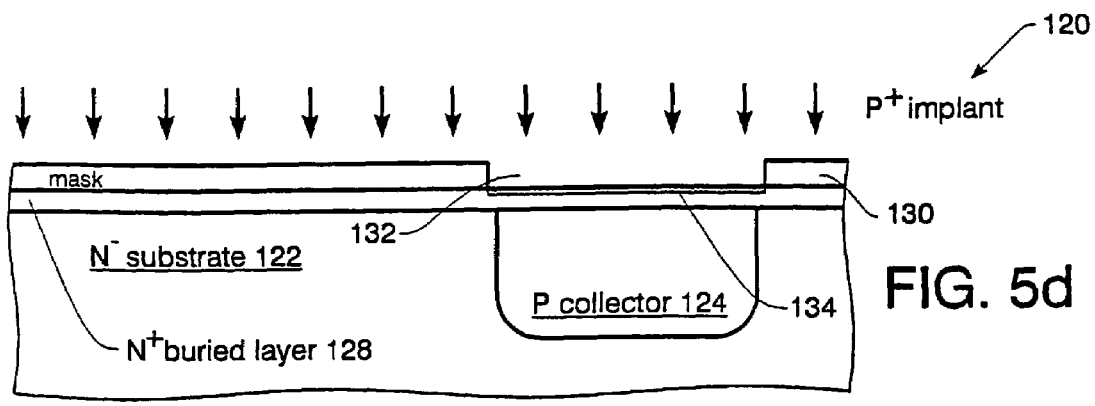

FIG. 5d depicts a further processing of portion 120 utilizing a mask 130 having an opening 132 through which P type dopants are implanted, as indicated by the arrows at the top of FIG. 5d, to form a surface layer 134 of P type dopants in opening 132. In one preferred embodiment, the P type dopant is boron, which has a faster diffusion coefficient than the N type dopant, arsenic, used in this preferred embodiment for the implantation of FIG. 5b.

Figure 5E:
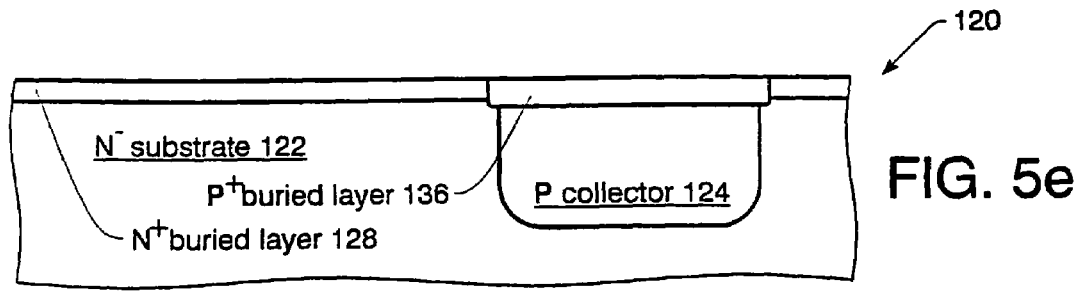

FIG. 5e is an optional process step before an epi layer is grown as depicted below in FIG. 5f. In this optional step the surface layer 134 is partially diffused to form a P+ buried layer 136. Either the entire diffusion or the completion of this partial diffusion shown in FIG. 5e is done sometime after the structure of FIG. 5g has been formed by the further processing of the wafer (not shown in the drawings).

Figure 5F:
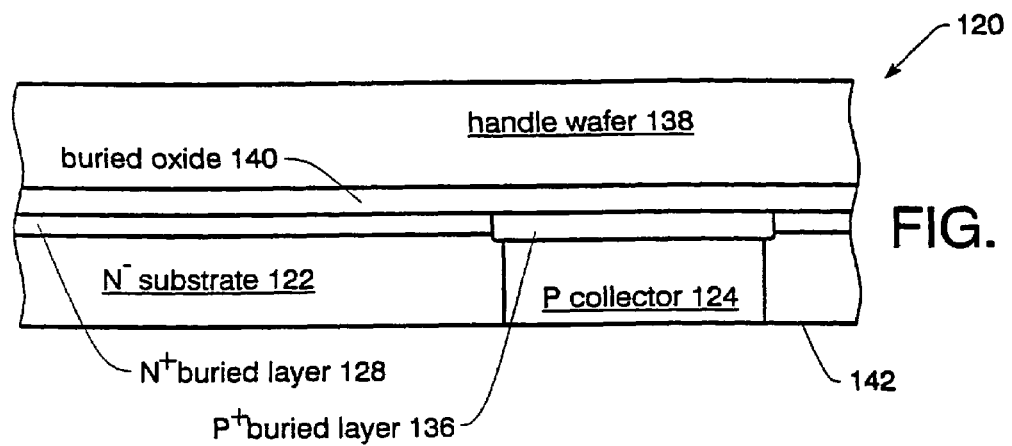

In FIG. 5f the device wafer of FIGS. 5a–5e is bonded to a handle wafer 138 with an insulator, shown as buried oxide 140, between them. Also, the bottom 142 of the device wafer is thinned to the desired thickness for device islands in the process and also intersecting the P collector diffusion so that the P collector 124 extends through the entire thickness of the final device wafer.

Figure 5G:
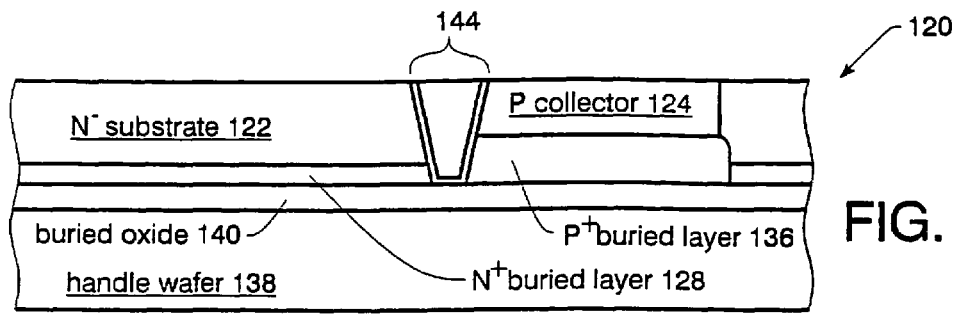

In FIG. 5g the portion 120 of FIG. 5f has been inverted and lateral isolation trenches, as indicated by lateral isolation trench 144, have been formed to extend down to the buried oxide 140.

In the above description the non selective N+ buried layer is formed before the selective P+ buried layer. The selective layer may be formed before the non selective layer as shown in FIGS. 6a–6e.

Figure 6A:
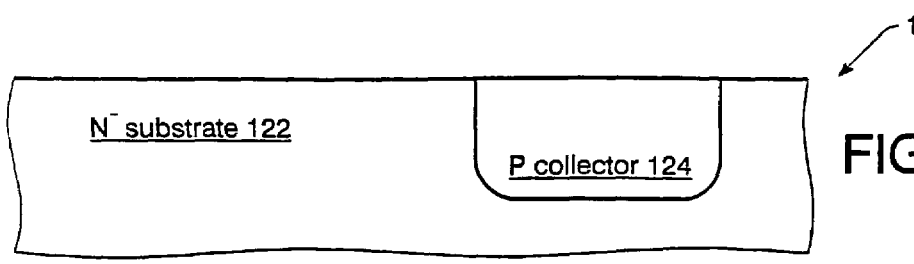
FIGS. 6a–6e illustrate an alternate process to that depicted in FIGS. 5a–5e.
Figure 7A:
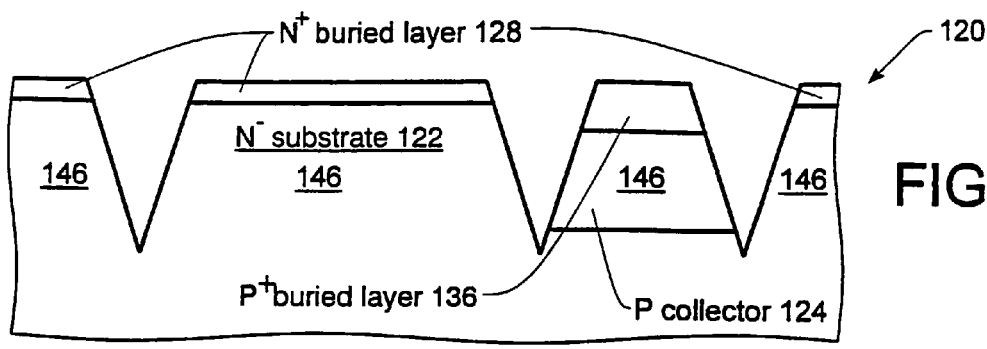
FIGS. 7a–7c are diagrammatical fragmentary cross sections of a portion of a structure used in the fabrication of an integrated circuit which depict a dual N+ and P+ buried layer single poly dielectric isolation structure with a non selective N+ buried layer in which the buried layers are formed in a surface of the device wafer that become the bottoms of the final device islands.
Figure 7B:
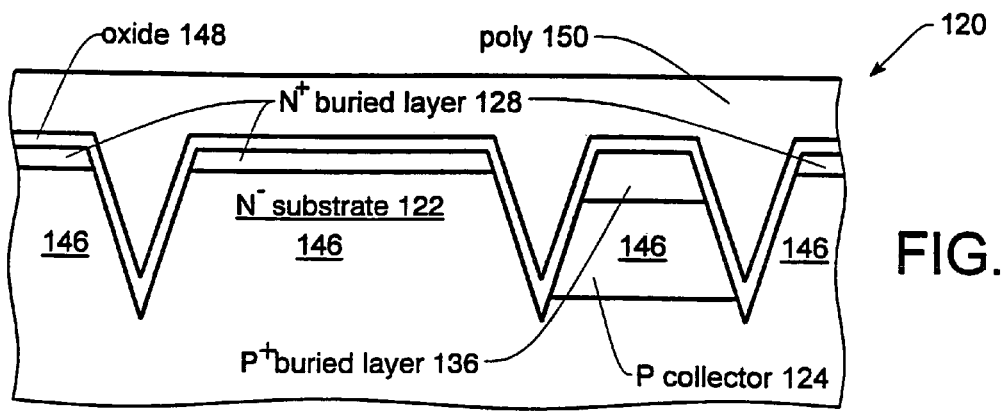
Figure 7C:
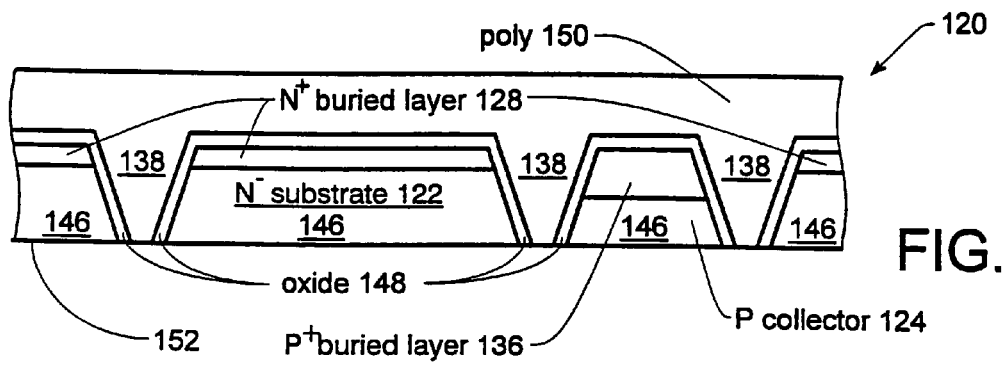

FIG. 6a is a redrawing of FIG. 5a for convenience.

Figure 6B:
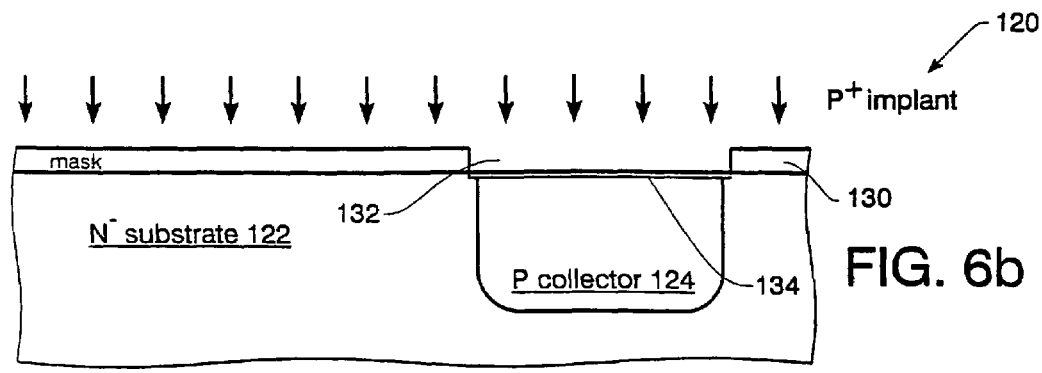

FIG. 6b depicts the mask 130 with an opening 132 and implanted to form the P+ surface region 134 as described above relative to FIG. 5d.

Figure 6C:
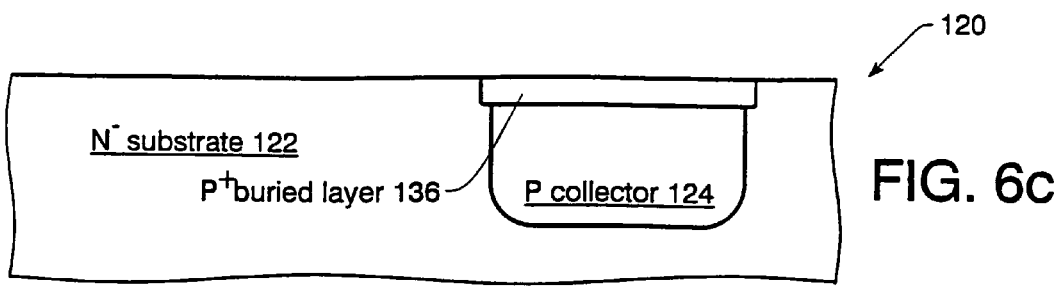

FIG. 6c is FIG. 6b after the P+surface region 134 has been diffused to form the P+ buried layer 136.

Figure 6D:
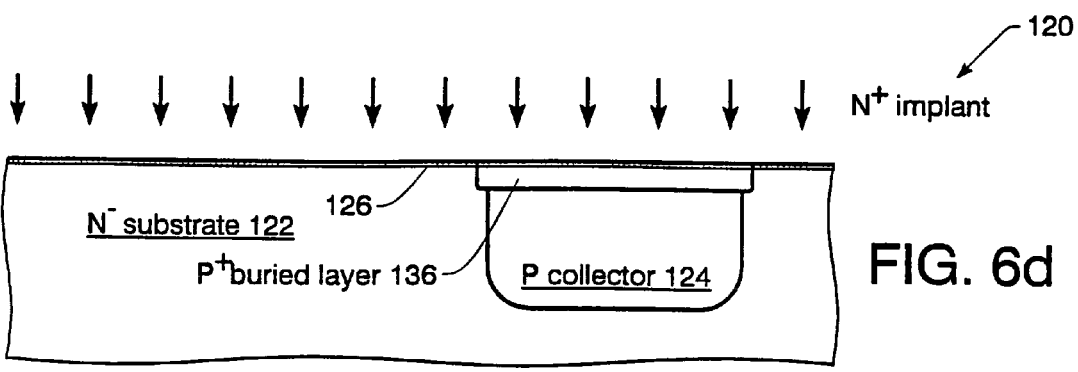

FIG. 6d depicts the non selective implantation of the N+ surface region 126 as described above relative to FIG. 5b.

Figure 6E:
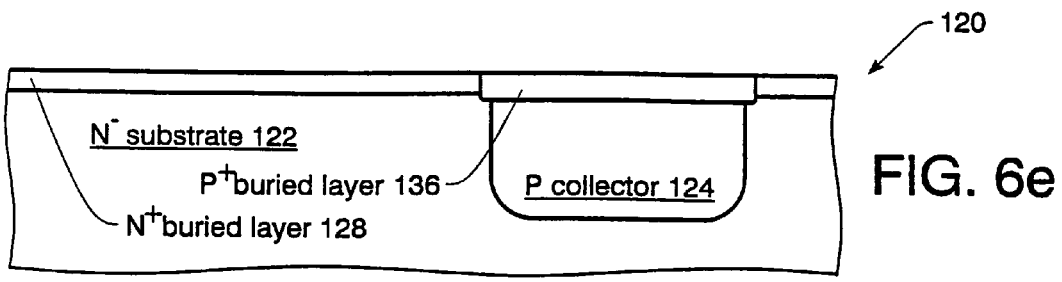

FIG. 6e is FIG. 6d after a diffusion operation with the N+ buried layer 128 formed after the diffusion. FIG. 6e is the same as FIG. 5e.

FIGS. 7a–7c depict a single poly dielectric isolation structure.

In FIG. 7a the portion 120 of FIG. 5e has been moat etched using a masked silicon etch to define a series of mesa shaped structures 146 which will become device islands completely separated by dielectric isolation as shown in the following FIGS. 7b and 7c.

In FIG. 7b the exposed top and side surfaces of the portion 120 have been oxidized to form as oxide 148, and polysilicon, shown as poly 150, has been deposited to fill the moats and build up a support thickness on the wafer.

In FIG. 7c the wafer has been thinned, as shown by bottom edge 152, to the thickness desired for islands 146 in which devices will be formed. In this process the moats of poly 150 are intersected to complete the formation of isolated islands 146, and the P collector 124 is intersected so that it extends through the entire thickness of the final device island 146.

Although the invention has been described in part by making detailed reference to a certain specific embodiment, such detail is intended to be, and will be understood to be, instructional rather than restrictive. It will be appreciated by those skilled in the art that many variations may be made on the structure and mode of operation without departing from the spirit and scope of the invention as disclosed in the teachings contained herein.

What is claimed is:

1. A method of fabricating a semiconductor device comprising the steps of:
   a) forming a non selective N+ type buried layer comprising a first majority dopant having a first coefficient of diffusion by implanting and diffusing said first majority dopant;
   b) forming a selective P+ type buried layer extending N+ type buried layer and comprising a second majority dopant having a coefficient of diffusion by implanting and diffusing said second majority dopant; greater than said first coefficient of diffusion;
   c) forming an N type epitaxial layer on said non selective N$^+$ type buried layer; and
   d) forming a P well extending from said selective P$^+$ type buried layer through said N type epitaxial layer.

2. The method set forth in claim 1 wherein the step of forming said non selective N+ type buried layer is performed before the step of forming said selective P+ type buried layer.

3. The method set forth in claim 1 wherein the step of forming said selective P+ type buried layer is performed before the step of forming said non selective N+ type buried layer.

4. The method set forth in claim 1 wherein the step of forming said selective P+ type buried layer includes the step of controlling the amount of said second majority dopant relative to the amount of said first majority dopant such that said selective P+ type buried layer over compensates said non selective N+ type buried layer completely throughout said non selective N+ type buried layer in a region where said selective P+ type buried layer is formed.

5. The method set forth in claim 1 wherein the step of forming said selective P+ type buried layer includes the step of controlling the amount of said second majority dopant relative to the amount of said first majority dopant such that said selective P+ type buried layer does not completely over compensate said N+ type buried layer throughout said non selective N+ type buried layer in a region where said selective P+ type buried layer is formed.

6. The method set forth in claim 1 wherein the step of forming said non selective N+ type buried layer includes the step of selecting said first majority dopant from one of arsenic or antimony and the step of forming said selective P+ type buried layer includes the step of selecting boron for said second majority dopant.

7. The method set forth in claim 1 wherein the step of forming said selective P+ type buried layer includes the step of controlling the amount of said second majority dopant relative to the amount of said first majority dopant such that said selective P+ type buried layer has a maximum dopant concentration greater than the maximum dopant concentration of said non selective N+ type buried layer.

8. The method set forth in claim 1 in which the dopants from the N type and P+ type buried layers epitaxial diffuse into the N+ type layer.

9. The method set forth in claim 8 in which the dopants of the P+ type buried layer extend further into the N type epitaxial layer than do the dopants of the N+ type buried layer.

10. The method set forth in claim 1 wherein the step of diffusing said first majority dopant includes the step of controlling said diffusion such that said second majority dopant up diffuses into said epitaxial layer.

11. The method set forth in claim 1 wherein the step of forming said N type epitaxial layer is performed before the step of diffusing said second majority dopant.

12. The method set forth in claim 11 wherein the step of forming said P well includes the step of controlling the amount of a majority dopant used in forming said P well relative to the amount of said first majority dopant such that the maximum majority dopant concentration of said non selective N+ type buried layer is greater than the maximum majority dopant concentration of said P well.

13. The method set forth in claim 1 wherein the steps of implanting and diffusing said first majority dopant are performed before the steps of implanting and diffusing said second majority dopant.

14. The method set forth in claim 1 further including the step of forming the N-type epitaxial layer on said selective P+ type buried layer after the step of implanting said second majority dopant.

15. The method set forth in claim 14 wherein the step of forming said epitaxial layer is performed before the step of diffusing said second majority dopant.

16. The method set forth in claim 15 wherein the step of diffusing said first majority dopant includes the step of controlling said diffusion such that said first majority dopant up diffuses into said epitaxial layer.

17. The method set forth in claim 14 wherein the step of forming said epitaxial layer is performed before the step of diffusing said first majority dopant.

18. The method set forth in claim 17 wherein the step of diffusing said first majority dopant includes the step of controlling said diffusion such that said first majority dopant up diffuses into said epitaxial layer.

19. A method of fabricating a semiconductor device in a wafer comprising the steps of:
 a) implanting across all of said wafer an N type dopant having a first coefficient of diffusion and at a first dose level;
 b) diffusing said N type dopant into said wafer to form an N+ type buried layer;
 c) masking a portion of said wafer;
 d) implanting into said wafer in areas not masked a P type dopant having a coefficient of diffusion greater than said first coefficient of diffusion; and
 e) diffusing said P type dopants into said wafer to form a P+ type buried layer;
 f) forming an N type epitaxial layer on said non selective N⁺ type buried layer; and
 g) forming a P well extending from said selective P⁺ type buried layer through said N type epitaxial layer.

20. The method set forth in claim 19 wherein the step of implanting said N type dopant is performed before the step of implanting said P type dopant.

21. The method set forth in claim 19 wherein the step of implanting said P type dopant is performed before the step of implanting said N type dopant.

22. The method set forth in claim 19 wherein the step of implanting said P type dopant includes the step of controlling the amount of said P type dopant relative to the amount of said N type dopant such that said P+ type buried layer has a maximum dopant concentration greater than the maximum dopant concentration of said N+ type buried layer.

23. The method set forth in claim 19 wherein the step of forming said N type epitaxial layer is performed before the step of diffusing said P type dopant.

24. The method set forth in claim 23 wherein the step of forming said P well includes the step of controlling the amount of a majority dopant used in forming said P well relative to the amount of said N type dopant such that the maximum majority dopant concentration of said N+ type buried layer is greater than the maximum majority dopant concentration of said P well.

25. The method set forth in claim 19 wherein the steps of implanting and diffusing said N type dopant are performed before the steps of implanting and diffusing said P type dopant.

26. The method set forth in claim 19 further including the additional step of forming an epitaxial layer on said P+ type buried layer after the step of implanting said P type dopant.

27. The method set forth in claim 26 wherein the step of forming said epitaxial layer is performed before the step of diffusing said P type dopant.

28. The method set forth in claim 27 wherein the step of diffusing said N type dopant includes the step of controlling said diffusion such that said N type dopant up diffuses into said epitaxial layer.

29. The method set forth in claim 26 wherein the step of forming said epitaxial layer is performed before the step of diffusing said N type dopant.

30. The method set forth in claim 29 wherein the step of diffusing said N type dopant includes the step of controlling said diffusion such that said N type dopant up diffuses into said epitaxial layer.

31. The method set forth in claim 19 wherein the step of implanting said N type dopant includes the step of selecting said N type dopant from one of arsenic or antimony and the step of implanting said P type dopant includes the step of selecting boron for said P type dopant.

* * * * *